(12) United States Patent
Zhu et al.

(10) Patent No.: US 11,830,961 B2
(45) Date of Patent: Nov. 28, 2023

(54) SILICON NITRIDE HARD MASK FOR EPITAXIAL GERMANIUM ON SILICON

(71) Applicant: Newport Fab, LLC, Newport Beach, CA (US)

(72) Inventors: Difeng Zhu, San Diego, CA (US); Edward J. Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 731 days.

(21) Appl. No.: 16/120,266

(22) Filed: Sep. 2, 2018

(65) Prior Publication Data
US 2020/0075792 A1  Mar. 5, 2020

(51) Int. Cl.
H01L 31/18 (2006.01)
H01L 31/105 (2006.01)

(52) U.S. Cl.
CPC ........ H01L 31/1804 (2013.01); H01L 31/105 (2013.01)

(58) Field of Classification Search
CPC ............... H01L 21/02293; H01L 21/20; H01L 21/2015; H01L 21/67063; H01L 21/67069; H01L 21/67075
See application file for complete search history.

(56) References Cited

U.S. PATENT DOCUMENTS

| | | | |
|---|---|---|---|
| 9,245,951 B1* | 1/2016 | Camillo-Castillo | ......................... H01L 21/31056 |
| 2002/0016081 A1* | 2/2002 | Aloni | ................ H01L 21/31116 438/714 |
| 2009/0108384 A1* | 4/2009 | Assefa | ................ H01L 31/1808 257/432 |
| 2013/0134483 A1* | 5/2013 | Adkisson | .......... H01L 29/66234 257/197 |
| 2015/0162322 A1* | 6/2015 | Shea | .................... H01L 27/0623 257/197 |
| 2015/0214387 A1* | 7/2015 | Kang | .................... H01L 31/028 257/432 |

(Continued)

OTHER PUBLICATIONS

Dehlinger, G., et al, "High-Speed Germanium-on-SOI Lateral PIN Photodiodes", IEEE Photonics Technology Letters, vol. 16, No. 11, Nov. 2004, 2 pages.

(Continued)

*Primary Examiner* — Julia Slutsker
(74) *Attorney, Agent, or Firm* — Bever, Hoffman & Harms, LLP (57) ABSTRACT

A germanium-on-silicon photodetector is fabricated by forming a thin silicon oxide layer on a silicon layer, and then forming a silicon nitride layer on the silicon oxide layer. A nitride dry etch process is used to etch an opening through the silicon nitride layer (through a photoresist mask). The nitride dry etch is stopped on the thin silicon oxide layer, preventing damage to the underlying silicon layer. A wet etch is then performed through the opening in the silicon nitride layer to remove the exposed silicon oxide layer. The wet etch exposes (and cleans) a portion of the underlying silicon layer. High-quality germanium is epitaxially grown over the exposed portion of the silicon layer, thereby providing a germanium structure that forms the intrinsic region of a PIN photodiode.

13 Claims, 5 Drawing Sheets

(56) References Cited

U.S. PATENT DOCUMENTS

2017/0179029 A1* 6/2017 Enquist ............ H01L 21/76838
2018/0090631 A1* 3/2018 Chen ................... H01L 31/1037

OTHER PUBLICATIONS

Yu, Hyun-Yong, et al, "High-Efficiency p-i-n Photodetectors on Selectivve-Area-Grown Ge for Monolithic Integration", IEEE Electron Device Letters, vol. 30, No. 11, Nov. 2009, 3 pages.
Zhang, Yi, et a., "A high-responsivity photodetector absent metal-germanium direct contact", Optics Express, vol. 22, No. 9, May 5, 2014, 9 pages.

* cited by examiner

SILICON NITRIDE HARD MASK FOR EPITAXIAL GERMANIUM ON SILICON

FIELD OF THE INVENTION

The present invention relates to an improved epitaxial germanium-on-silicon photodetector structure, as well as a method for fabricating the same.

RELATED ART

Germanium-on-silicon structures have been used to implement photodetectors (photodiodes) in modern communication systems. In general, germanium is provided as an intrinsic semiconductor structure between a p-type semiconductor region and an n-type semiconductor region, such that germanium-on-silicon photodetectors are sometimes referred to as PIN (P-type/Intrinsic/N-type) photodetectors. The p-type and n-type semiconductor regions of a PIN photodetector can be formed in the germanium layer (in a lateral PIN design), in the silicon layer (in a lateral PIN design), or in both of these layers (in a vertical PIN design).

During normal operation, the diode formed by the PIN photodetector structure is reverse biased. Under reverse bias conditions, the diode of the PIN photodetector structure does not conduct (other than a small dark current). When a photon of sufficient energy enters the depletion region of the diode, an electron-hole pair is created. The reverse bias field sweeps the carriers out of the depletion region, creating a current. The depletion region of the diode extends across the intrinsic region (e.g., the germanium structure). The width of the depletion region is relatively wide (compared with a conventional PN diode), thereby enabling electron-hole pair generation deep within the device, increasing the quantum efficiency of the PIN photodetector. Germanium-on-silicon PIN photodetectors feature fast response times (several tens of gigahertz) making them ideal for high speed optical telecom applications.

Because germanium can be epitaxially grown on silicon and is compatible with CMOS processing, germanium has become the preferred light-absorbing material in silicon photonics. Germanium-on-silicon PIN photodetectors generally provide high bandwidth, good responsivity and low dark current.

Figure 1A:
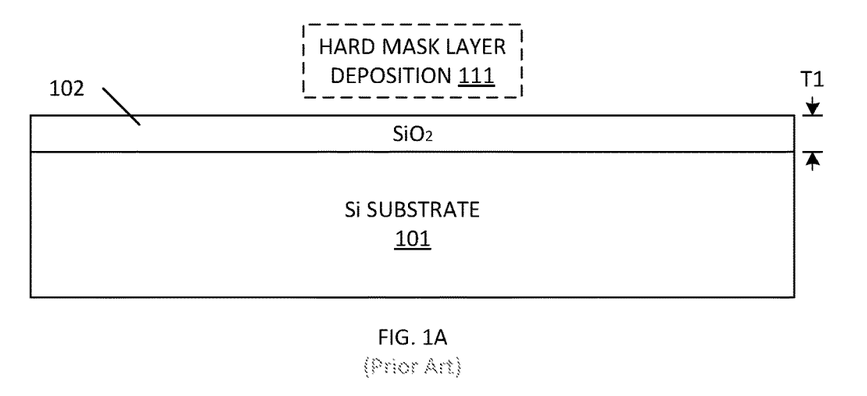
FIGS. 1A, 1B, 1C, 1D and 1E are cross sectional views of semiconductor regions during various stages of the fabrication of a conventional germanium-on-silicon photodetector structure.

FIGS. 1A-1E are cross sectional views of various semiconductor structures during fabrication of a conventional epitaxial germanium-on-silicon photodetector. As illustrated by FIG. 1A, a hard mask layer deposition step 111 is performed, wherein silicon oxide layer 102 is initially deposited over silicon substrate 101. In order to use silicon oxide layer 102 as a hard mask in the manner described below, the silicon oxide layer 102 must have a relatively large thickness (T1), typically in the range of about 500 to 1000 Angstroms.

Figure 1B:
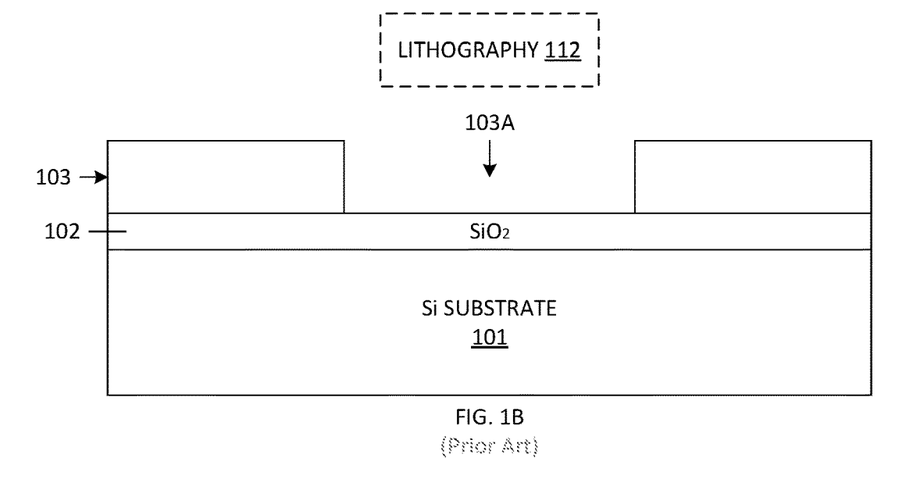

As illustrated by FIG. 1B, lithography steps 112 are performed, wherein a layer of photoresist formed over silicon oxide layer 102 is patterned, exposed and developed to form a photoresist mask 103 having an opening 103A. This opening 103A defines the location where a germanium epitaxial layer is subsequently formed.

Figure 1C:
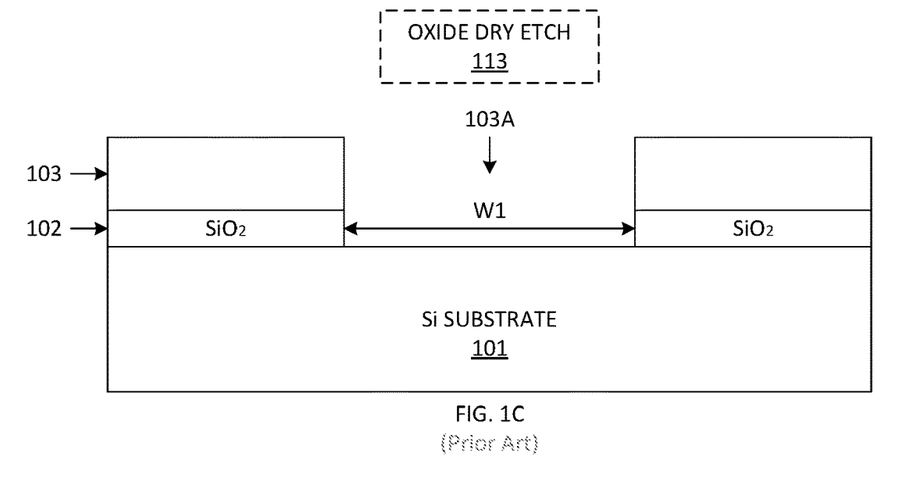

As illustrated by FIG. 1C, an oxide dry etch step 113 is performed through the opening 103A of photoresist mask 103, such that the portion of silicon oxide layer 102 exposed through opening 103A is removed, thereby exposing a portion of the upper surface 101A of the silicon substrate 101. The oxide dry etch involves the use of plasmas or etchant gases to remove the exposed portion of the silicon oxide layer 102. Dry etching is used due to its unique ability (compared to wet etching) to perform anisotropic etching to create high aspect ratio structures (e.g., deep holes or trenches), such as those required by a hard mask structure. Note that the width (W1) of the opening formed in the silicon oxide layer 102 closely corresponds with the width of the opening 103A in the photoresist mask 103. However, it is difficult to control the timing of the dry etch to end precisely at the upper surface of silicon substrate 101. Consequently, the dry etch is typically ended in response to detecting that the silicon substrate 101 has been exposed. However, in this case, the dry etching damages the crystalline structure of the exposed upper surface 101A of the silicon substrate 101. This damage can degrade the quality of a subsequently grown epitaxial germanium layer.

Figure 1D:
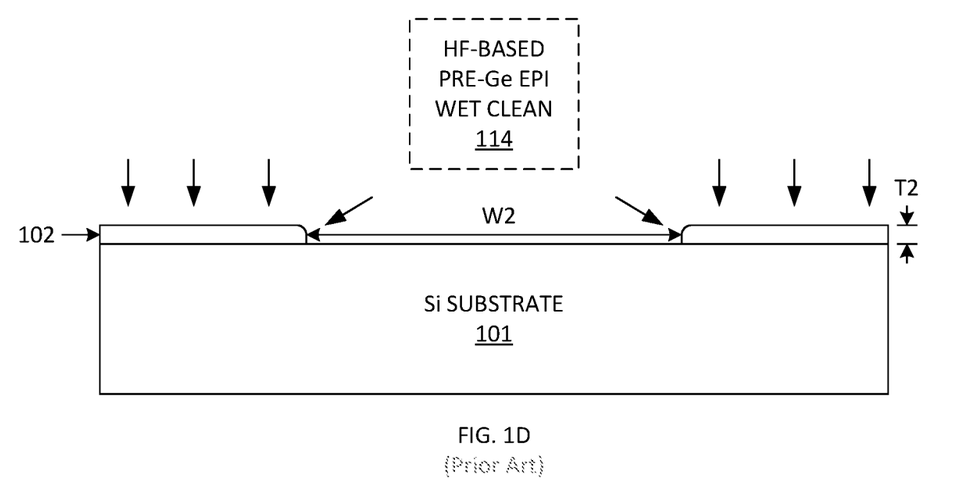

As illustrated by FIG. 1D, a hydrogen fluoride (HF) based wet clean step 114 is the performed to remove native oxide, clean residues and prepare the upper surface 101A of the silicon substrate 101 for the subsequent growth of epitaxial germanium. However, the HF-based wet clean step 114 also attacks the silicon oxide hard mask 102 from the top and the sides (as indicated by the arrows in FIG. 1D). As a result, the width of the opening formed through silicon oxide layer 102 is undesirably increased (e.g., from W1 to W2), which degrades a critical dimension of the resulting germanium structure, and may even 'destroy' one or more germanium open area patterns (not shown). Note that the width W2 may be larger than the width W1 by 50 nm to 240 nm, or even more. Thus, if the width W1 is 1 micron, then the width W2 may be about 1.05 microns to about 1.24 microns (or even more). For this reasons, it may be difficult to control the final width W2.

The wet clean step 114 also reduces the thickness of the silicon oxide hard mask 102 (e.g., from T1 to T2). To protect the silicon oxide hard mask 102 during the wet clean step 114, very limited HF is used. However, limiting the amount of HF used undesirably results in the potential risk of not properly cleaning the upper surface of the silicon substrate 101 prior to the epitaxial growth of germanium. Thus, it is a challenge to control the HF-based wet clean step 114 to provide the desired results.

Figure 1E:
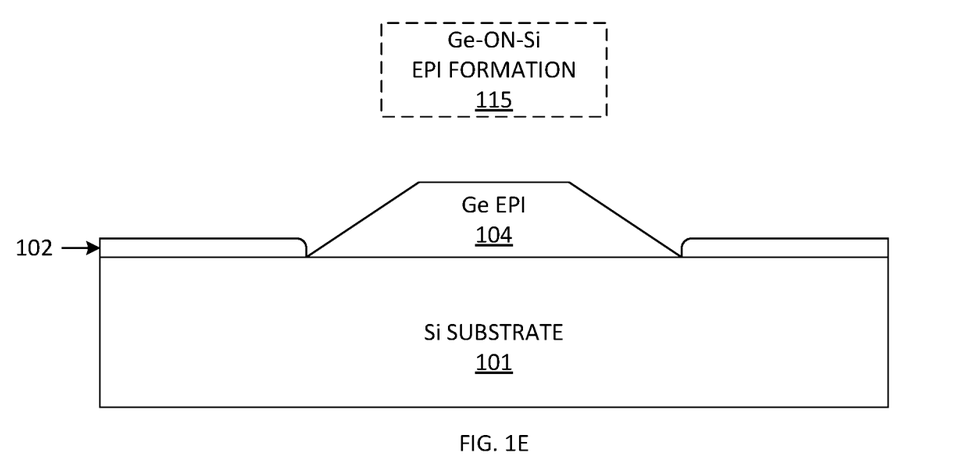

As illustrated by FIG. 1E, a germanium layer 104 is epitaxially grown over the portion of the upper surface of silicon substrate 101 exposed through silicon oxide hard mask 102.

In general, germanium layer 104 may form the intrinsic layer of a PIN photodetector structure. As mentioned above, n-type semiconductor regions and p-type semiconductor regions can be formed in silicon substrate 101 and/or germanium layer 104 to form the PIN photodetector structure. Exemplary configurations of such n-type and p-type regions are described by: (1) Dehlinger, G., et al., "High-speed Germanium-on-SOI Lateral PIN Photodiodes." *IEEE Photonics Technology Letters* 16.11 (2004): 2547-2549, which shows a lateral PIN design, with N+ and P+ regions formed in the upper surface of a germanium layer, (2) Yu, Hyun-Yong, et al., "High-efficiency PIN Photodetectors on Selective-Area-Grown Ge for Monolithic Integration." *IEEE Electron Device Letters* 30.11 (2009): 1161-1163, which shows a vertical PIN design with an N+ region formed at an upper region of a germanium layer and a P+ region formed at a lower region of the germanium layer, and (3) Zhang, Yi, et al., "A High-Responsivity Photodetector Absent Metal-Germanium Direct Contact." *Optics Express* 22.9 (2014): 11367-11375, which shows a lateral PIN design that includes p++ and n++ regions formed in an upper surface of a germanium layer, a vertical PIN design that includes an n++ region formed in an upper surface of a germanium layer and a p+ region formed in an underlying silicon substrate, and a lateral PIN design that includes a p-type silicon region that contacts one end of a germanium layer, and an n-type silicon region that contacts an opposite end of the germanium layer.

It would therefore be desirable to have an improved method for forming an epitaxial germanium-on-silicon structure that overcomes the deficiencies of the conventional methods described above.

SUMMARY

Accordingly, the present invention provides an improved method for fabricating a germanium-on-silicon photodetector structure. In one embodiment, this method includes: (1) forming a silicon oxide layer over a silicon substrate; (2) forming a silicon nitride layer over the silicon oxide layer; (3) performing a dry nitride etch through a mask to create an opening through the silicon nitride layer, wherein the dry nitride etch is stopped upon exposing the silicon oxide layer; (4) performing a wet etch through the opening in the silicon nitride layer using a hydrogen fluoride (HF) based etchant, wherein the HF-based etchant removes portions of the silicon oxide layer exposed through the opening in the silicon nitride layer, and exposes a portion of the silicon substrate; and (5) epitaxially growing a germanium structure on the exposed portion of the silicon substrate, through the opening in the silicon nitride layer. In a particular embodiment, the silicon oxide layer is significantly thinner than the silicon nitride layer. For example, silicon oxide layer may have a thickness in the range of about 100 to 200 Angstroms, and silicon nitride layer may have a thickness in the range of about 300 to 1000 Angstroms.

Advantageously, the silicon oxide layer prevents the nitride dry etch from damaging the upper surface of the underlying silicon layer. The wet etch does not attack the silicon nitride layer. The wet etch is controlled to ensure that the exposed portions of the silicon oxide layer are completely removed (ensuring that the exposed upper surface of the silicon substrate is clean), without any significant deleterious effects. That is, the amount of HF-based etchant required to reliably etch through the exposed portions of the silicon oxide layer only results in slight lateral etching of the silicon oxide layer under the silicon nitride layer. As a result, the critical dimensions of the opening through the silicon nitride layer (and the silicon oxide layer) are maintained, allowing for precise control of the dimensions of the subsequently grown epitaxial germanium structure. The improved epitaxial germanium structure results in PIN photodetectors having a small dark current, high responsivity and large bandwidth.

In accordance with another embodiment, the present invention provides an improved germanium-on-silicon photodetector structure that includes a silicon substrate, a silicon oxide layer located over the silicon substrate, and a silicon nitride layer located over the silicon oxide layer, wherein an opening extends through the silicon nitride layer and the silicon oxide layer to an upper surface of the silicon substrate. An epitaxial germanium structure is formed on the upper surface of the silicon substrate, wherein the epitaxial germanium structure extends through the opening in the silicon nitride layer and the silicon oxide layer.

The present invention will be more fully understood in view of the following description and drawings.

DETAILED DESCRIPTION

Figure 2A:
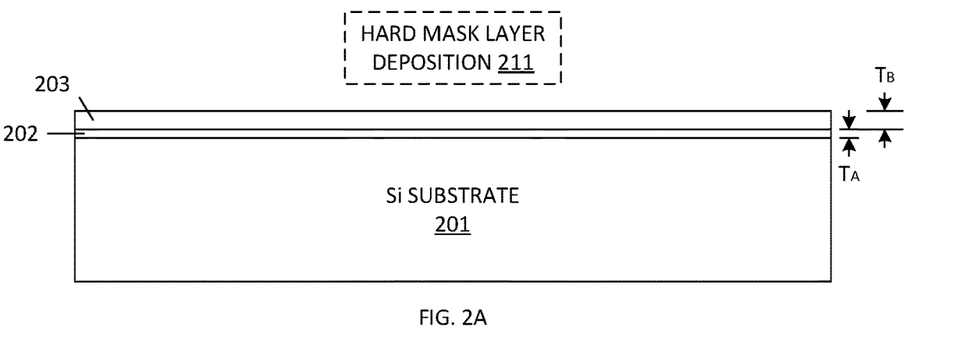
FIGS. 2A, 2B, 2C, 2D and 2E are cross sectional views of semiconductor regions during various stages of the fabrication of a germanium-on-silicon photodetector structure in accordance with the present invention.

FIGS. 2A-2E are cross sectional views of various semiconductor structures during fabrication of an epitaxial germanium-on-silicon photodetector structure in accordance with one embodiment of the present invention. Initially, a hard mask structure is formed over a silicon substrate. As illustrated by FIG. 2A, hard mask layer deposition steps 211 are performed, wherein a thin silicon oxide layer 202 is deposited over silicon substrate 201, and a silicon nitride layer 203 is deposited over the silicon oxide layer. In the described embodiments, thin silicon oxide layer 202 has a relatively small thickness ($T_A$) in the range of about 100 to 200 Angstroms, and silicon nitride layer 203 has a relatively large thickness ($T_B$) in the range of about 300 to 1000 Angstroms. In a particular embodiment, silicon nitride layer 203 has a thickness ($T_B$) in the range of about 750 to 850 Angstroms. As will become apparent in view of the following description, the thickness $T_B$ of silicon nitride layer 203 is selected to be large enough to form an effective hard mask through which an epitaxial germanium layer may be grown.

Figure 2B:
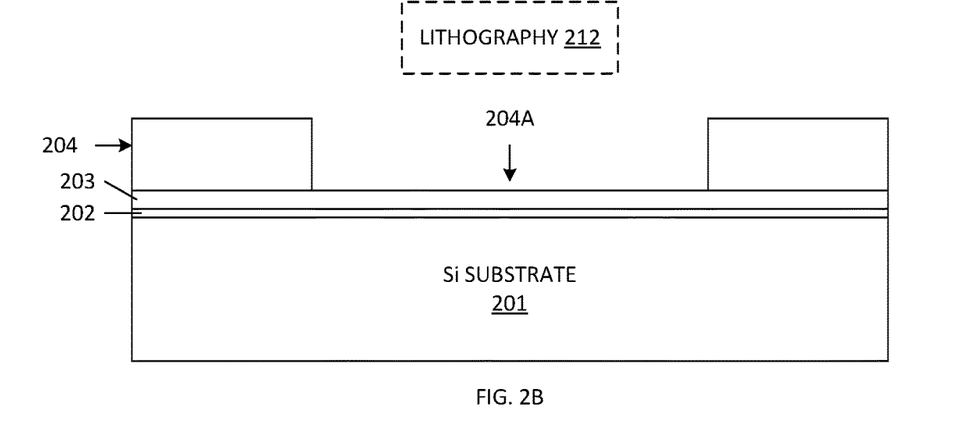

As illustrated by FIG. 2B, lithography steps 212 are performed, wherein a layer of photoresist formed over silicon nitride layer 203 is patterned, exposed and developed to form a photoresist mask 204 having an opening 204A. This opening 204A defines the location where a germanium epitaxial layer is subsequently formed.

Figure 2C:
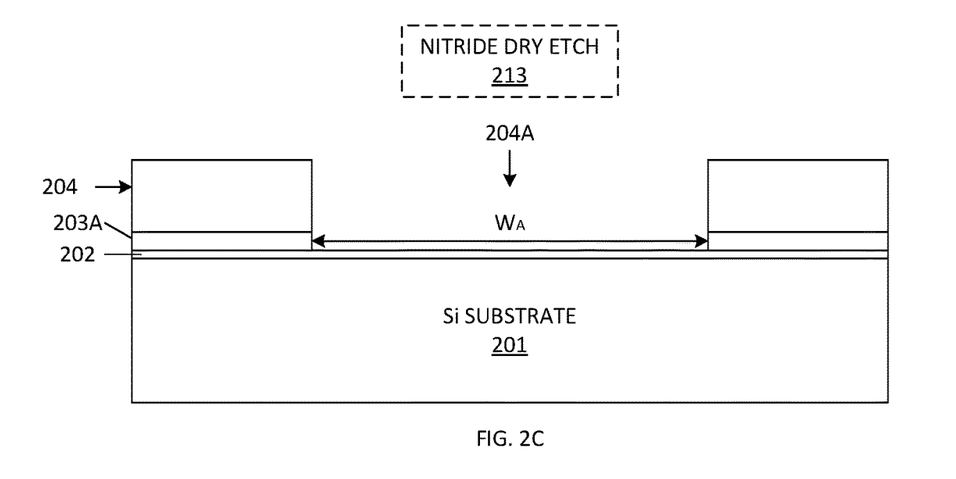

As illustrated by FIG. 2C, a nitride dry etch step 213 is performed through the opening 204A of photoresist mask 204, such that the portion of silicon nitride layer 203 exposed through opening 204A is removed, thereby exposing a portion of the upper surface of the silicon oxide layer 202. The nitride dry etch involves the use of plasmas or etchant gases to remove the exposed portion of the silicon nitride layer 203. Any typical nitride dry etch with reasonable oxide selectivity (i.e., a tetrafluoromethane/oxygen ($CF_4/O_2$) based nitride dry etch and/or a sulfur hexafluoride ($SF_6$) based nitride dry etch) can be used to remove the exposed portion of silicon nitride layer 203 in this flow. The nitride dry etch is stopped in response to detecting that the underlying silicon oxide layer 202 is exposed. That is, the underlying silicon oxide layer 202 serves as an etch-stop for the nitride dry etch step 213. Advantageously, silicon oxide layer 202 provides protection for the upper surface of the silicon substrate 201 during the nitride dry etch step 213, such that the nitride dry etch step 213 does not damage the upper surface of silicon substrate 201. In accordance with one embodiment, the thickness of the silicon oxide layer 202 is selected to have the minimum thickness required to allow the silicon nitride dry etch 213 to be stopped, without damaging the underlying silicon substrate 201. In a particular embodiment, thin silicon oxide layer 202 has a thickness $T_A$ of about 100 Angstroms (or less), which should be just thick enough to achieve the above-stated goal. In another embodiment, thin silicon oxide layer 202 has a thickness $T_A$ of about 200 Angstroms or less. In yet another embodiment, thin silicon oxide layer 202 has a thickness $T_A$ in the range of about 50 to 500 Angstroms.

The nitride dry etch step ensures that the etched silicon nitride layer 203 exhibits substantially vertical sidewalls. Note that the width ($W_A$) of the opening 203A formed in the silicon nitride layer 203 closely corresponds with the width of the opening 204A in the photoresist mask 204. In one embodiment, the width $W_A$ is about 2400 nm (although other widths are possible in other embodiments).

Figure 2D:
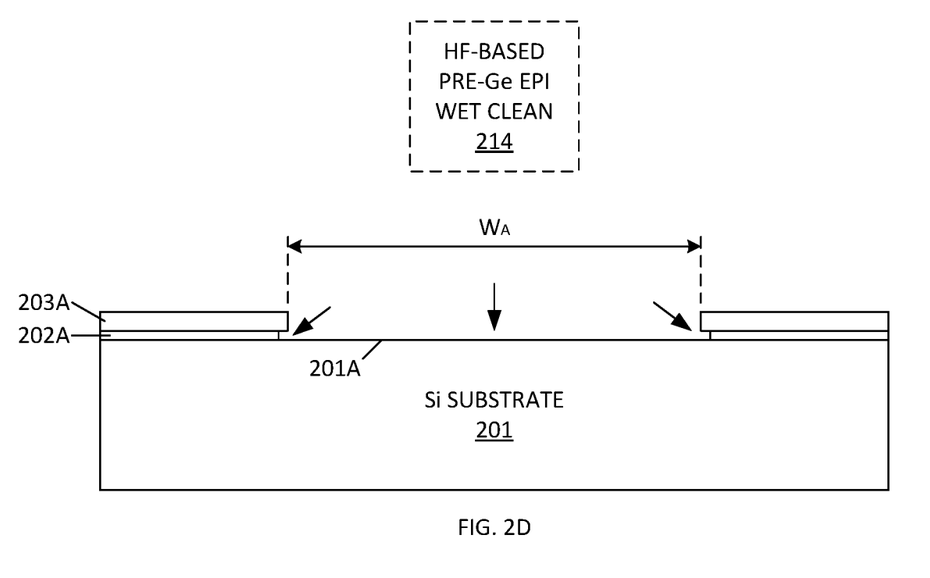

As illustrated by FIG. 2D, the photoresist mask 204 is stripped, and a hydrogen fluoride (HF) based wet clean step 214 is then performed to remove silicon oxide layer 202, thereby exposing a portion of the upper surface of silicon substrate 201. Any typical oxide etcher with good selectivity on nitride (e.g., diluted 100:1 HF (in volume)) can be used to remove silicon oxide layer 202. Silicon nitride layer 203 is resistive to the HF-based etchant, such that the wet clean step 214 does not reduce the thickness ($T_B$) of the silicon nitride layer 203. Although the HF-based wet clean step 214 also attacks the thin silicon oxide layer 202 from the sides (as indicated by the arrows in FIG. 2D), the area exposed to the HF-based etchant is relatively small (as defined by the relatively small thickness $T_A$ of the silicon oxide layer 202). As a result, the width of the opening formed through the silicon oxide layer 202 is only slightly larger than the width $W_A$. In one embodiment, the silicon oxide layer 202 is laterally etched by much less than 60 nm (and in some cases less than about 100 Angstroms) under the silicon nitride layer 203. This undercut of the silicon oxide layer 202 does not affect the width ($W_A$) of the opening 203A in the silicon nitride layer 203. Consequently, the critical (width) dimension of the subsequently formed germanium structure is not affected by the wet clean step 214. Moreover, more process margin and better process control is achieved with this wet clean step 214 (when compared with the wet clean step 114 of FIG. 1D). That is, the exposed portion of silicon oxide layer 202 can be reliably (and completely) removed, while minimizing the amount of silicon oxide layer 202 removed from under the silicon nitride layer 203. As a result, a clean silicon surface 201A having well defined dimensions is provided prior to growth of epitaxial germanium.

Figure 2E:
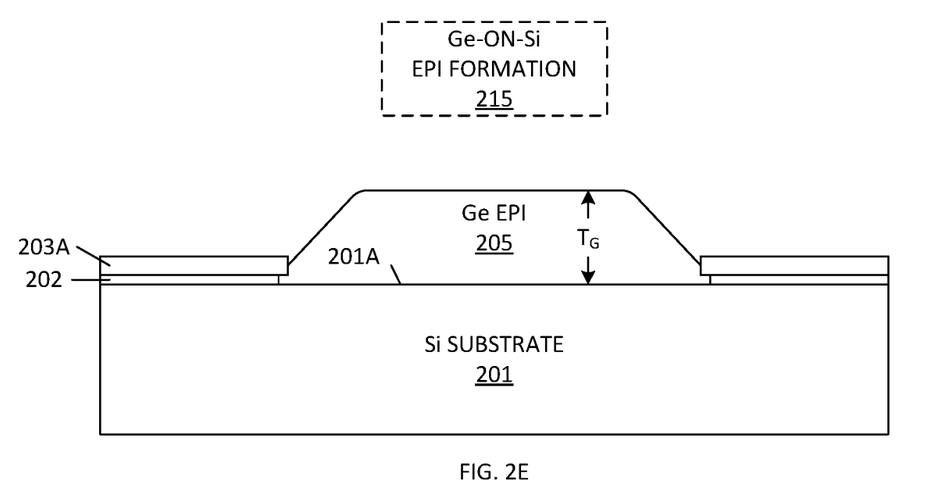

As illustrated by FIG. 2E, a germanium layer 205 is epitaxially grown over the upper surface 201A of silicon substrate 201 exposed through the openings in silicon nitride layer 203 and silicon oxide layer 202. Any conventional method for growing a germanium-on-silicon epitaxial layer can be used to grow germanium layer 205. The clean, damage-free upper surface 201A of silicon substrate 201 results in the growth of a high quality epitaxial germanium layer 205. In one embodiment, epitaxial germanium layer 205 is grown to a thickness ($T_G$) in the range of about 400 to 600 nm, although other thicknesses are possible. Silicon nitride layer 203 exhibits good selectivity with respect to the epitaxial growth of germanium, such that no germanium is grown on silicon nitride layer 203 during the epitaxial growth of germanium layer 205. Note that the width ($W_A$) of the opening 203A in the silicon nitride layer 203 advantageously defines the width of the base of the epitaxial germanium layer 205.

Various methods can be used to form p-type regions and n-type regions in the epitaxial germanium layer 205 in order to create a PIN photodetector structure.

Figure 3A:
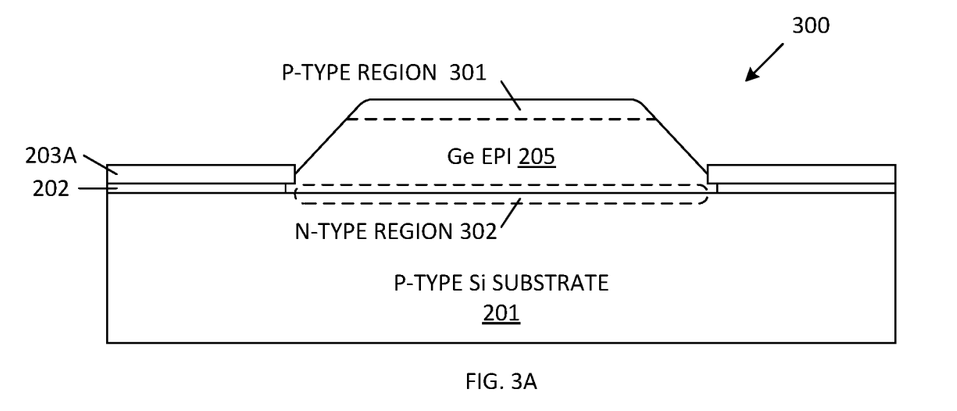
FIG. 3A is a cross-sectional view of a vertical PIN photodetector structure that implements the epitaxial germanium layer of FIGS. 2A-2E in accordance with one embodiment of the present invention.

FIG. 3A is a cross-sectional view of an exemplary vertical PIN photodetector structure 300 that implements the epitaxial germanium layer 205 of the present invention. Vertical PIN photodetector structure 300 includes an n-type semiconductor region 302, which can be formed by introducing a n-type dopant, such a phosphorus, into the upper surface of p-type silicon substrate 201 prior to the epitaxial formation of germanium structure 205. Vertical PIN photodetector structure 300 also includes a p-type semiconductor region 301, which can be formed by introducing an p-type dopant, such as boron, into the upper surface of germanium structure 205. Note that an intrinsic germanium layer 205 exists between p-type region 301 and n-type region 302.

Figure 3B:
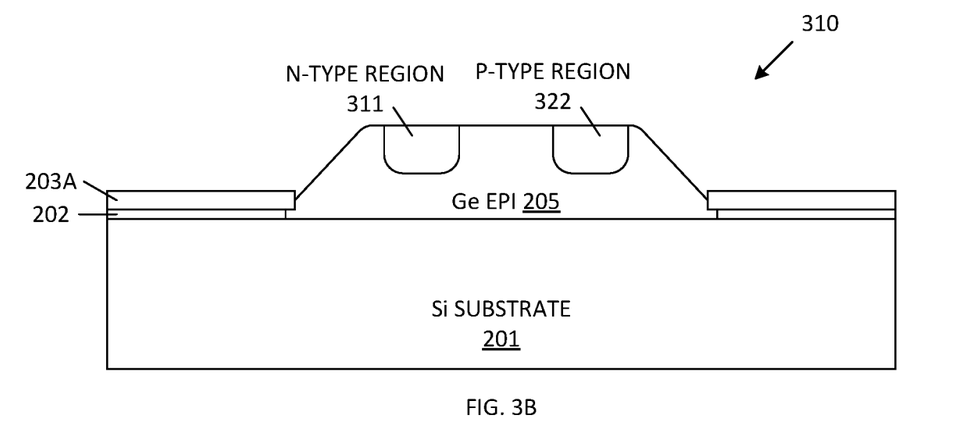
FIG. 3B is a cross-sectional view of a horizontal PIN photodetector structure that implements the epitaxial germanium layer of FIGS. 2A-2E in accordance with one embodiment of the present invention.

FIG. 3B is a cross-sectional view of an exemplary horizontal PIN photodetector structure 310 that implements the epitaxial germanium layer 205 of the present invention. Horizontal PIN photodetector structure 300 includes an n-type semiconductor region 311 formed by selectively introducing an n-type dopant into a first region of the upper surface of germanium structure 205, and a p-type semiconductor region 312 formed by selectively introducing a p-type dopant into a second region of the upper surface of germanium structure 205.

Various other types of PIN photodetector structures, such as those presented in the above mentioned references: (1) Dehlinger, G., et al., (2) Yu, Hyun-Yong, et al., and (3) Zhang, Yi, et al., may also be improved by using the epitaxial germanium structure 205 and method of the present invention. It is further understood that the epitaxial germanium structure 205 and method of the present invention can be applied to improve other conventional PIN photodetector structures.

Germanium-on-silicon photodetector structures (e.g., structures 300 and 310) formed using the epitaxial germanium structure 205 of the present invention exhibit electrical and optical performance that is improved with respect to that exhibited by conventional germanium-on-silicon photodetector structures. More specifically, the high quality epitaxial germanium layer 205 results in a photodetector having a low dark current, high responsivity and large bandwidth.

Although the invention has been described in connection with several embodiments, it is understood that this invention is not limited to the embodiments disclosed, but is capable of various modifications, which would be apparent to a person skilled in the art. Thus, the invention is limited only by the following claims.

We claim:

1. A method for fabricating a semiconductor device comprising:
forming a silicon oxide layer over a silicon substrate, wherein the silicon oxide layer has an upper surface;
forming a silicon nitride layer over the upper surface of the silicon oxide layer;
performing a dry nitride etch through a mask to create an opening through the silicon nitride layer, wherein the dry nitride etch is stopped upon exposing the upper surface of the silicon oxide layer;
performing a wet etch through the opening in the silicon nitride layer using a hydrogen fluoride (HF) based etchant, wherein the HF-based etchant removes portions of the silicon oxide layer exposed through the opening, starting from the exposed upper surface of the silicon oxide layer, and exposes a portion of the silicon substrate, wherein the wet etch laterally removes portions of the silicon oxide layer under the silicon nitride layer; and epitaxially growing a germanium layer on the exposed portion of the silicon substrate, through the opening in the silicon nitride layer.

2. The method of claim 1, wherein the dry etch comprises a $CF_4$ and $O_2$ based nitride dry etch.

3. The method of claim 1, wherein the dry etch comprises a $SF_6$ based nitride dry etch.

4. The method of claim 1, wherein the wet etch comprises an HF based oxide wet etch.

5. The method of claim 1, further comprising forming the silicon oxide layer to a thickness of 200 Angstroms or less.

6. The method of claim 5, further comprising forming the silicon oxide layer to a thickness of 100 Angstroms or less.

7. The method of claim 5, further comprising forming the silicon nitride layer to a thickness of 300 to 1000 Angstroms.

8. The method of claim 7, further comprising forming the silicon nitride layer to a thickness of 750 to 850 Angstroms.

9. The method of claim 1, further comprising growing the germanium layer to a thickness of about 400 to 600 nm.

10. The method of claim 1, wherein the exposed portion of the silicon substrate has a width of about 2400 nm.

11. The method of claim 1, further comprising:
forming an n-type region in the germanium layer; and
forming a p-type region in the germanium layer, wherein the n-type region is separated from the p-type region within the germanium layer.

12. The method of claim 1, wherein the wet etch laterally removes less than 100 Angstroms of the silicon oxide layer under the silicon nitride layer.

13. The method of claim 1, further comprising:
introducing a dopant having a first conductivity type into the silicon substrate prior to epitaxially growing the germanium layer, whereby a first region having the first conductivity type is formed at a lower surface of the germanium layer; and
introducing a dopant having a second conductivity type, opposite the first conductivity type, into an upper surface of the germanium layer, thereby forming a second region having the second conductivity type at the upper surface of the germanium layer, wherein the first region is separated from the second region.

* * * * *